United States Patent
Bauer et al.

(10) Patent No.: US 9,484,216 B1
(45) Date of Patent: Nov. 1, 2016

(54) METHODS FOR DRY ETCHING SEMICONDUCTOR DEVICES

(71) Applicant: Sandia Corporation, Albuquerque, NM (US)

(72) Inventors: Todd Bauer, Albuquerque, NM (US); Andrew John Gross, Redwood City, CA (US); Peggy J. Clews, Tijeras, NM (US); Roy H. Olsson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/728,810

(22) Filed: Jun. 2, 2015

(51) Int. Cl.
| | |
|---|---|
| *H01L 21/3065* | (2006.01) |
| *H01L 41/332* | (2013.01) |
| *H01L 41/331* | (2013.01) |
| *H01L 41/18* | (2006.01) |
| *H01L 21/308* | (2006.01) |
| *H01L 21/311* | (2006.01) |
| *H01L 21/3213* | (2006.01) |

(52) U.S. Cl.
CPC ......... *H01L 21/3065* (2013.01); *H01L 21/308* (2013.01); *H01L 21/31116* (2013.01); *H01L 21/31122* (2013.01); *H01L 21/32136* (2013.01); *H01L 21/32139* (2013.01); *H01L 41/18* (2013.01); *H01L 41/331* (2013.01); *H01L 41/332* (2013.01)

(58) Field of Classification Search
None
See application file for complete search history.

(56) References Cited

U.S. PATENT DOCUMENTS

| | | |
|---|---|---|
| 4,256,534 A | 3/1981 | Levinstein et al. |
| 5,624,529 A | 4/1997 | Shul et al. |
| 7,081,415 B2 | 7/2006 | Wang |
| 7,196,017 B2 | 3/2007 | Mirkarimi et al. |
| 7,385,334 B1 | 6/2008 | Olsson et al. |
| 7,514,760 B1* | 4/2009 | Quevy ............... B81C 1/00246 257/414 |
| 7,652,547 B1 | 1/2010 | Wittwer et al. |
| 8,367,305 B1 | 2/2013 | Wojciechowski et al. |
| 8,497,747 B1 | 7/2013 | Wojciechowski et al. |
| 8,522,411 B1 | 9/2013 | Bouche et al. |
| 8,669,823 B1 | 3/2014 | Olsson et al. |
| 2001/0025826 A1* | 10/2001 | Pierson ............. H01L 21/30621 216/55 |
| 2004/0209437 A1* | 10/2004 | Chiu ................... H01L 21/3065 438/424 |

OTHER PUBLICATIONS

Aigner R, "MEMS in RF filter applications: thin-film bulk acoustic wave technology," *Sensors Update* Feb. 2003;12(1):175-210.

Bliznetsov V et al., "Improving aluminum nitride plasma etch process for MEMS applications," *J. Micromech. Microeng.* 2013;23:117001 (6 pp.).

Chanchani R et al., "A new wafer-level packaging technology for MEMS with hermetic micro-environment," *IEEE Electronic Components and Technology Conf.*, held on May 31-Jun. 3, 2011, in Lake Buena Vista, FL, pp. 1604-1609.

Cleland AN et al., "Single-crystal aluminum nitride nanomechanical sensors," *Appl. Phys. Lett.* 2001;79(13):2070-2.

(Continued)

*Primary Examiner* — Jiong-Ping Lu
(74) *Attorney, Agent, or Firm* — Aman Talwar

(57) ABSTRACT

The present invention provides methods for etching semiconductor devices, such aluminum nitride resonators. The methods herein allow for devices having improved etch profiles, such that nearly vertical sidewalls can be obtained. In some examples, the method employs a dry etch step with a primary etchant gas that omits $BCl_3$, a common additive.

22 Claims, 9 Drawing Sheets

(56) References Cited

OTHER PUBLICATIONS

Danner DA et al., "Plasma etching of aluminum: a comparison of chlorinated etchants," *J. Electrochem. Soc.* 1987;134(3):669-73.
Donnelly VM et al., "Plasma etching: yesterday, today, and tomorrow," *J. Vac. Sci. Technol. A* 2013;31:050825 (48 pp.).
Fan L et al., "Aluminum nitride piezo-acoustic-photonic crystal nanocavity with high quality factors," *Appl. Phys. Lett.* 2013;102:153507 (4 pp.).
Hahn YB et al., "Effect of additive noble gases in chlorine-based inductively coupled plasma etching of GaN, InN, and AlN," *J. Vac. Sci. Technol. A* 1999;17(3):768-73.
Henry MD et al., "Frequency trimming of aluminum nitride microresonators using rapid thermal annealing," *J. Microelectromech. Sys.* 2014;23(3):620-7.
Henry MD et al., "Hermetic wafer-level packaging for RF MEMs: effects on resonator performance," *IEEE Electronic Components and Technology Conf.*, held on May 29-Jun. 1, 2012, in San Diego, CA, pp. 362-369.
Kadota M et al., "High-frequency Lamb wave device composed of MEMS structure using $LiNbO_3$ thin film and air gap," *IEEE Trans. Ultrason. Ferroelectr. Freq. Control* Nov. 2010;57(11):2564-71.
Khan FA et al., "High rate etching of AlN using $BCl_3/Cl_2$/Ar inductively coupled plasma," *Mater. Sci. Eng. B* 2002;95:51-4.
Kim B et al., "AlN microresonator-based filters with multiple bandwidths at low intermediate frequencies," *J. Microelectromech. Sys.* 2013;22(4):949-61.
Kim B et al., "Capacitive frequency tuning of AlN micromechanical resonators," *Int'l Solid-State Sensors, Actuators and Microsystems Conf. ('TRANSDUCERS')*, held on Jun. 5-9, 2011 in Beijing, China, pp. 502-505.
Kim B et al., "Ovenized and thermally tunable aluminum nitride microresonator," *Int'l Ultrasonics Symp. Proc.*, held on Oct. 11-14, 2010, in San Diego, CA, pp. 974-978.
Liang J et al., "Design and fabrication of aluminum nitride Lamb wave resonators toward high figure of merit for intermediate frequency filter applications," *J. Micromech. Microeng.* 2015;25:035016 (10 pp.).
Malocha DC, "SAW/BAW acoustoelectronic technology for filters and communication systems," *Proc. 2010 IEEE 11th Annu. Wireless & Microwave Technol. Conf. (WAMICON)*, held on Apr. 12-13, 2010 in Melbourne, FL, pp. 1-7.
Marauska S et al., "Sputtered thin film piezoelectric aluminum nitride as a functional MEMS material," *Microsyst. Technol.* 2012;18:787-95.
Néel D et al., "Aluminum nitride photonic crystals and microdiscs for ultra-violet nanophotonics," *Adv. Nat. Sci.* 2014;5:023001 (7 pp.).

Nordquist CD et al., "On/off micro-electromechanical switching of AlN piezoelectric resonators," *IEEE MTT-S Int'l Microwave Symp. Digest*, held on Jun. 2-7, 2013 in Seattle, WA, pp. 1-4.
Olsson RH et al., "A high electromechanical coupling coefficient SH0 Lamb wave lithium niobate micromechanical resonator and a method for fabrication," *Sens. Actuat. A* 2014;209:183-90.
Olsson RH et al., "Post-CMOS compatible aluminum nitride MEMS filters and resonant sensors," *IEEE Int'l Frequency Control Symp. joint with the European Frequency and Time Forum*, held on May 29-Jun. 1, 2007, in Geneva, Switzerland, pp. 412-419.
Olsson RH et al., "Post-CMOS-compatible aluminum nitride resonant MEMS accelerometers," *J. Microelectromech. Sys.* 2009;18(3):671-8.
Pernice WHP et al., "High-Q aluminum nitride photonic crystal nanobeam cavities," *Appl. Phys. Lett.* 2012;100:091105 (4 pp.).
Piazza G et al., "Piezoelectric aluminum nitride thin films for microelectromechanical systems," *MRS Bull.* 2012;37:1051-61.
Shah AP et al., "ICP-RIE etching of polar, semi-polar and non-polar AlN: comparison of $Cl_2$/Ar and $Cl_2/BCl_3$/Ar plasma chemistry and surface pretreatment," *Semicond. Sci. Technol.* 2015;30:015021 (6 pp.).
Shah AP et al., "Inductively coupled plasma reactive ion etching of III-nitride semiconductors," *AIP Conf. Proc.* 2013;1512:494-5.
Shul RJ et al., "Selectively inductively coupled plasma etching of group-III nitrides in $Cl_2$—and $BCl_3$—based plasmas," *J. Vac. Sci. Technol. A* 1998;16(3):1621-6.
Wang R et al., "Thin-film lithium niobate contour-mode resonators," *Proc. 2012 IEEE Int'l Ultrason. Symp. (IUS)*, held on Oct. 7-10, 2012, in Dresden, Germany, pp. 303-306.
Wojciechowski KE et al., "Single-chip precision oscillators based on multi-frequency, high-Q aluminum nitride MEMS resonators," *Int'l Solid-State Sensors, Actuators and Microsystems Conf. ('TRANSDUCERS')*, held on Jun. 21-25, 2009 in Denver, CO, pp. 2126-2130.
Wojciechowski KE et al., "Super high frequency width extensional aluminum nitride (AlN) MEMS resonators," *IEEE Ultrasound Symp. Proc.*, held on Sep. 20-23, 2009, in Rome, Italy, pp. 1179-1182.
Xiong C et al., "Aluminum nitride as a new material for chip-scale optomechanics and nonlinear optics," *New J. Phys.* 2012;14:095014 (21 pp.).
Xiong C et al., "Low-loss, silicon integrated aluminum nitride photonic circuits and their use for electro-optic signal processing," *Nano Lett.* 2012;12:3562-8.
Yang J et al., "Researching the aluminum nitride etching process for application in MEMS resonators," *Micromachines* 2015;6:281-90.
Yantchev V et al., "Thin film Lamb wave resonators in frequency control and sensing applications: a review," *J. Micromech. Microeng.* 2013;23:043001 (14 pp.).

\* cited by examiner

METHODS FOR DRY ETCHING SEMICONDUCTOR DEVICES

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention provides methods for etching semiconductor materials and devices composed of such materials. In particular, the methods rely on dry etching techniques, e.g., plasma etching that employs one or more etchant gases.

BACKGROUND OF THE INVENTION

Devices formed from semiconductor materials can possess unique electromechanical properties imparted by the material. However, device performance can be negatively affected by techniques employed to etch the semiconductor material. For instance, some wet chemistry techniques provide isotropic etching, in which a high aspect ratio structure is difficult to attain. Dry chemistry techniques, such as those employing plasma, generally provide anisotropic etching in which etching occurs more favorably in one dimension. Thus, high aspect ratio structures can be more readily achieved using dry chemistry techniques. Yet additional processes are required, as some dry chemistry techniques can be optimized to provide smooth, etched surfaces but at a trade-off for etch rates, sidewall angles, etc.

III-V semiconductor materials have numerous device applications. When etching III-V materials containing aluminum, it is generally believed that $BCl_3$ is required in order to remove and etch any aluminum oxides present in the material (see, e.g., U.S. Pat. No. 5,624,529). Thus, most processes require $BCl_3$ throughout the entire etching process at particularly favorable percentages (see, e.g., U.S. Pat. No. 7,196,017). While such $BCl_3$-containing processes can provide smooth sidewalls, vertical sidewalls (i.e., approaching an angle of 90°) are still difficult to attain. In some III-V devices, such as resonators, vertical sidewalls improve quality factors and reduce detrimental spurious modes. Thus, there is a need for additional processes to provide vertical sidewalls in semiconductor devices.

SUMMARY OF THE INVENTION

The present invention relates to dry etching processes to provide a vertical sidewall. For instance, the methods herein can be employed to achieve vertical sidewalls in a III-V film (e.g., an aluminum nitride (AlN) film), which in turn can be used to fabricate radiofrequency (RF) MEMS microresonators. In particular, AlN-based microresonators can be designed to possess a resonant frequency ranging from 1 MHz to 3 GHz, which have utility in various tools, such as communication devices. Forming AlN resonators with vertical sidewalls can reduce spurious modes and improve the quality factor of the resonator, both of which are key figures of merit for resonators.

In some embodiments, the integrated process includes an optimized microfabrication process and an optimized etching process. In some embodiments, the integrated process includes employing a hard mask (e.g., a silicon dioxide hard mask) to pattern the semiconductor material; etching the hard mask by employing a plasma etch process that eliminates transfer of sidewall slope from the hard mask to the semiconductor; etching the semiconductor by avoiding passivating agents, such as by minimizing use of nitrogen and boron trichloride during the main etch step; and removing the hard mask by using an anisotropic plasma etch process that etches the mask but does not etch the semiconductor material, thereby minimizing use of isotropic, wet chemical etch conditions.

Accordingly, in one aspect, the invention features a method for etching a semiconductor, the method including: placing a patterned semiconductor into a plasma reactor, where the patterned semiconductor includes a semiconductor material and a hard mask, where the hard mask defines at least one trench pattern; and etching an exposed semiconductor material located in proximity to the trench pattern by introducing a primary etchant gas into the plasma reactor for a primary etching period (e.g., thereby providing an etched semiconductor).

In some embodiments, the hard mask is disposed directly or indirectly on a planar surface of the semiconductor material. In other embodiments, at least one trench pattern of the hard mask was etched by employing a plasma etch process (e.g., a fluorine-based chemistry including one or more fluorocarbon gases, as described herein).

In some embodiments, the primary etchant gas includes $Cl_2$ and/or does not include $BCl_3$. In some embodiments, the primary etchant gas consists essentially of $Cl_2$. In other embodiments, the primary etchant gas does not include Ar and/or $N_2$. In yet other embodiments, the primary etchant gas consists essentially of $Cl_2$ and one or more non-chlorine containing gases.

In further embodiments, the method includes (e.g., before the etching step) introducing a first supplementary gas into the plasma reactor for a first supplemental period. In particular embodiments, the first supplementary gas includes $BCl_3$. In other embodiments, a duration of the first supplemental period is less than a duration of the primary etching period. In some embodiments, the duration of the first supplemental period is of from about 5 seconds to about 60 seconds, and where the duration of the primary etching period is of from about 90 seconds to about 420 seconds.

In further embodiments, the method includes (e.g., after an introducing step) introducing a second supplementary gas into the plasma reactor for a second supplemental period. In particular embodiments, the second supplementary gas includes $BCl_3$. In other embodiments, a duration of the second supplemental period is less than a duration of the primary etching period. In some embodiments, the duration of the second supplemental period is of from about 5 seconds to about 60 seconds, and where the duration of the primary etching period is of from about 90 seconds to about 420 seconds.

In further embodiments, the method includes (e.g., after the etching step) removing the hard mask by employing a highly selective anisotropic oxide etch (e.g., optionally including a fluorine-based chemistry). In some embodiments, the method includes (e.g., after the removing step) releasing a portion of the etched semiconductor (e.g., thereby providing a released resonator portion). In yet other embodiments, the releasing step includes etching a release layer of a semiconductor stack or a patterned semiconductor.

In another aspect, the invention features a method for etching a semiconductor, the method including: placing a patterned semiconductor into a plasma reactor, where the patterned semiconductor includes a semiconductor material and a hard mask, where the hard mask defines at least one trench pattern; introducing a first supplementary gas into the plasma reactor for a first supplemental period (e.g., where the first supplementary gas includes $BCl_3$); etching an exposed semiconductor material located in proximity to the trench pattern by introducing a primary etchant gas into the plasma reactor for a primary etching period (e.g., where the primary etchant gas includes $Cl_2$ and/or does not include $BCl_3$); and introducing a second supplementary gas into the plasma reactor for a second supplemental period (e.g., where the second supplementary gas includes $BCl_3$). In some embodiments, the hard mask is disposed directly or indirectly on a planar surface of the semiconductor material.

In some embodiments, the method further includes removing the hard mask by employing a highly selective anisotropic oxide etch (e.g., thereby providing an etched semiconductor). In other embodiments, a duration of each of the first and the second supplemental periods is, independently, less than a duration of the primary etching period.

In yet another aspect, the invention features a method for fabricating a semiconductor resonator, the method including: placing a patterned semiconductor into a plasma reactor, where the patterned semiconductor includes a piezoelectric material and a hard mask, where the hard mask defines at least one trench pattern that provides a first dimension of a resonator portion; introducing a first supplementary gas into the plasma reactor for a first supplemental period (e.g., where the first supplementary gas includes $BCl_3$); and etching an exposed semiconductor material located in proximity to the trench pattern by introducing a primary etchant gas into the plasma reactor for a primary etching period (e.g., where the primary etchant gas includes $Cl_2$ and/or does not include $BCl_3$), thereby defining at least one dimension of the resonator portion. In some embodiments, the hard mask is disposed directly or indirectly on a planar surface of the semiconductor material.

In some embodiments, the method further includes introducing a second supplementary gas into the plasma reactor for a second supplemental period (e.g., where the second supplementary gas includes $BCl_3$); removing the hard mask by employing a highly selective anisotropic oxide etch; and releasing a portion of the etched semiconductor (e.g., thereby defining a second dimension of the resonator portion and providing the semiconductor resonator). In some embodiments, a duration of each of the first and the second supplemental periods is, independently, less than a duration of the primary etching period.

In any embodiment herein, the semiconductor material includes a piezoelectric material, an aluminum nitride, a III-V material, lithium niobate, lithium tantalate, as well as doped forms thereof, multilayered forms thereof, or stacked forms of any of these.

In any embodiment herein, the patterned semiconductor includes a semiconductor stack. In some embodiments, the semiconductor stack includes a piezoelectric layer (e.g., including a piezoelectric material, an aluminum nitride, a III-V material, lithium niobate, lithium tantalate, as well as doped forms or multilayered forms thereof) and/or a bottom electrode layer disposed beneath the piezoelectric layer and/or an insulator layer disposed between the bottom electrode layer and a substrate. In particular embodiments, the stack or the substrate further includes a release layer (e.g., an amorphous layer or an ion-damaged region).

In any embodiment herein, the plasma reactor is an inductively coupled plasma reactor (ICP), an electron-cyclotron-resonance (ECR) plasma, a helicon plasma, or a surface wave plasma. In particular embodiments, the inductively coupled plasma reactor is operated at a source power of from about 500 W to about 2000 W and at a bias of from about 40 W to about 200 W. In some embodiments, the plasma reactor is maintained at a low operating pressure less than about 25 mTorr. In other embodiments, the plasma reactor is maintained at a low operating pressure of from about 1 mTorr to about 50 mTorr (e.g., 1 mTorr to 10 mTorr, 1 mTorr to 25 mTorr, 1 mTorr to 40 mTorr, 5 mTorr to 10 mTorr, 5 mTorr to 25 mTorr, 5 mTorr to 40 mTorr, 5 mTorr to 50 mTorr, 10 mTorr to 25 mTorr, 10 mTorr to 40 mTorr, 10 mTorr to 50 mTorr, 15 mTorr to 25 mTorr, 15 mTorr to 40 mTorr, 15 mTorr to 50 mTorr, 20 mTorr to 25 mTorr, 20 mTorr to 40 mTorr, or 20 mTorr to 50 mTorr).

In any embodiment herein, a vertical sidewall of the etched semiconductor has a sidewall angle greater than about 80° (e.g., of from about 80° to about 100°, such as from 80° to about 90°, 80° to about 95°, 85° to about 90°, 85° to about 95°, 85° to about 100°, 88° to about 90°, 88° to about 95°, 88° to about 100°, 90° to about 95°, 90° to about 100°, 92° to about 95°, 92° to about 100°, or 95° to about 100°).

In any embodiment herein, the duration of the primary etching period is of from about 30 seconds to about 600 seconds (e.g., 30 seconds to 60 seconds, 30 seconds to 90 seconds, 30 seconds to 100 seconds, 30 seconds to 120 seconds, 30 seconds to 180 seconds, 30 seconds to 210 seconds, 30 seconds to 240 seconds, 30 seconds to 270 seconds, 30 seconds to 300 seconds, 30 seconds to 360 seconds, 30 seconds to 420 seconds, 30 seconds to 480 seconds, 30 seconds to 540 seconds, 60 seconds to 90 seconds, 60 seconds to 100 seconds, 60 seconds to 120 seconds, 60 seconds to 180 seconds, 60 seconds to 210 seconds, 60 seconds to 240 seconds, 60 seconds to 270 seconds, 60 seconds to 300 seconds, 60 seconds to 360 seconds, 60 seconds to 420 seconds, 60 seconds to 480 seconds, 60 seconds to 540 seconds, 60 seconds to 600 seconds, 90 seconds to 100 seconds, 90 seconds to 120 seconds, 90 seconds to 180 seconds, 90 seconds to 210 seconds, 90 seconds to 240 seconds, 90 seconds to 270 seconds, 90 seconds to 300 seconds, 90 seconds to 360 seconds, 90 seconds to 420 seconds, 90 seconds to 480 seconds, 90 seconds to 540 seconds, or 90 seconds to 600 seconds).

In any embodiment herein, the duration of the first and/or second supplemental period is of from about 5 seconds to about 60 seconds (e.g., 5 seconds to 10 seconds, 5 seconds to 15 seconds, 5 seconds to 30 seconds, 5 seconds to 45 seconds, 10 seconds to 15 seconds, 10 seconds to 30 seconds, 10 seconds to 45 seconds, 10 seconds to 60 seconds, 20 seconds to 30 seconds, 20 seconds to 45 seconds, 20 seconds to 60 seconds, 30 seconds to 45 seconds, 30 seconds to 60 seconds, 40 seconds to 45 seconds, 40 seconds to 60 seconds, or 45 seconds to 60 seconds), and/or the duration of the primary etching period is of from about 90 seconds to about 420 seconds (e.g., 90 seconds to 100 seconds, 90 seconds to 120 seconds, 90 seconds to 180 seconds, 90 seconds to 210 seconds, 90 seconds to 240 seconds, 90 seconds to 270 seconds, 90 seconds to 300 seconds, 90 seconds to 360 seconds, 100 seconds to 120 seconds, 100 seconds to 180 seconds, 100 seconds to 210 seconds, 100 seconds to 240 seconds, 100 seconds to 270 seconds, 100 seconds to 300 seconds, 100 seconds to 360 seconds, 100 seconds to 420 seconds, 120 seconds to 180 seconds, 120 seconds to 210 seconds, 120 seconds to 240 seconds, 120 seconds to 270 seconds, 120 seconds to 300 seconds, 120 seconds to 360 seconds, 120 seconds to 420 seconds, 180 seconds to 210 seconds, 180 seconds to 240 seconds, 180 seconds to 270 seconds, 180 seconds to 300 seconds, 180 seconds to 360 seconds, 180 seconds to 420 seconds, 210 seconds to 240 seconds, 210 seconds to 270 seconds, 210 seconds to 300 seconds, 210 seconds to 360 seconds, 210 seconds to 420 seconds, 240 seconds to 270 seconds, 240 seconds to 300 seconds, 240 seconds to 360 seconds, 240 seconds to 420 seconds, 270 seconds to 300 seconds, 270 seconds to 360 seconds, 270 seconds to 420 seconds, 300 seconds to 360 seconds, 300 seconds to 420 seconds, or 360 seconds to 420 seconds)

DEFINITIONS

As used herein, the term "about" means +/−10% of any recited value. As used herein, this term modifies any recited value, range of values, or endpoints of one or more ranges.

By "micro" is meant having at least one dimension that is less than 1 mm. For instance, a microstructure (e.g., any structure described herein) can have a length, width, height, cross-sectional dimension, circumference, radius (e.g., external or internal radius), or diameter that is less than 1 mm.

By "nano" is meant having at least one dimension that is less than 1 μm. For instance, a nanostructure (e.g., any structure described herein) can have a length, width, height, cross-sectional dimension, circumference, radius (e.g., external or internal radius), or diameter that is less than 1 μm.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

DETAILED DESCRIPTION OF THE INVENTION

The present invention provides an improved method for etching a semiconductor (e.g., including a semiconductor material, a III-V material, a piezoelectric material, or any other described herein). In particular, the methods herein combine microfabrication processes and etching processes that result in vertical sidewalls that are perpendicular to a major plane of the semiconductor film or layer.

Figure 1:
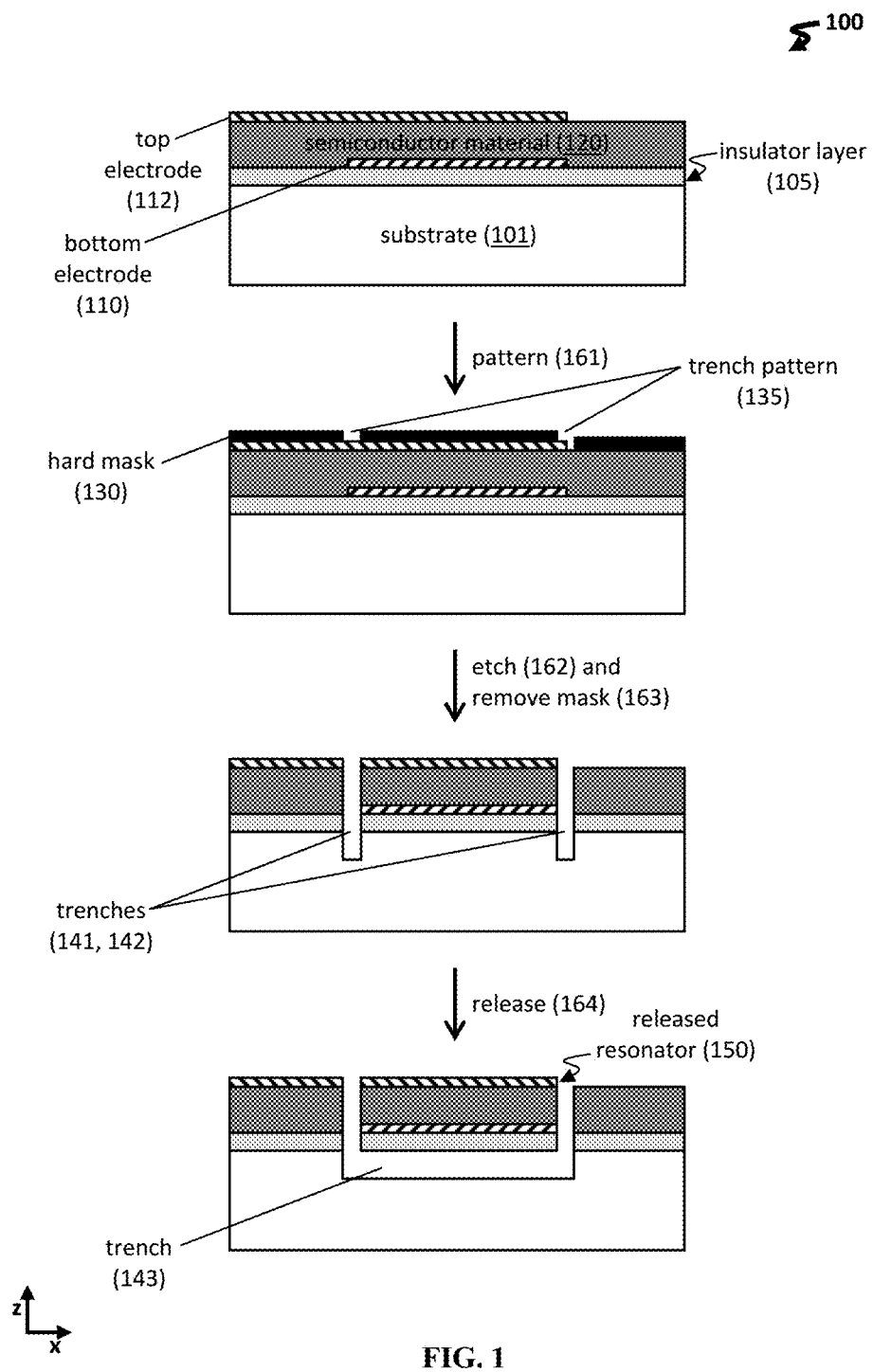
FIG. 1 is a schematic of an exemplary method 100 for etching a semiconductor.

FIG. 1 provides an exemplary method 100 for etching a semiconductor. The semiconductor can have any useful structure. For instance, as shown in FIG. 1, the semiconductor includes a substrate 101 (e.g., an Si substrate) and an insulator layer 105 (e.g., an $SiO_2$ layer) disposed between the active layers and the substrate 101. The active layers include one or more electrodes 110, 112 and a semiconductor material 120.

The semiconductor material 120 can be any useful material, such as any described herein. In certain embodiments, the material is any that can be etched by chlorine (e.g., a III-V material, an aluminum-containing material, a silicon-containing material, a niobate material, or a tantalate material). In other embodiments, the semiconductor material is provided as a semiconductor stack including a layer of the semiconductor material, as well as any other useful materials (e.g., a substrate, an insulator layer, one or more electrode layers, etc.).

As seen in FIG. 1, the exemplary method 100 for etching a semiconductor includes any useful step, including patterning 161 a hard mask on a planar surface of a semiconductor material; etching 162 the semiconductor material, as well as optionally etching the electrodes 110, 112, the insulator layer 105, and/or the substrate 101, or portions thereof; removing 163 the hard mask; and releasing 164 a portion of the semiconductor. These steps are detailed below.

The patterning step 161 includes depositing a material to form a hard mask 130 on a planar surface of the semiconductor material 120, thereby providing a patterned semiconductor. The material can be deposited either directly or indirectly on a portion of the planar surface. For instance, if an electrode layer is disposed on a portion of the top surface of the semiconductor material, then a hard mask is indirectly deposited on the semiconductor surface due to the interleaving electrode layer. The hard mask 130 can include any useful pattern, such as a trench pattern 135 that defines at least one dimension (e.g., along the x- and/or y-axis) of the desired trench to be formed in the semiconductor.

In some embodiments, the patterning step includes use of a silicon dioxide hard mask instead of the industry standard photoresist mask. The challenging characteristic of the photoresist mask is that photoresist erodes during the etch process, thereby contributing carbon to the plasma chemistry. This carbon can contribute to a sidewall polymer that passivates the sidewall of the semiconductor as it is etched. In contrast, a silicon dioxide hard mask does not contain carbon, so it does not contribute to the undesirable sidewall polymer.

In yet other embodiments, the hard mask is formed from a plasma etch process that provides vertical sidewalls for the patterns etched into the hard mask. At times, sloping sidewalls of the mask, if present, can contribute to sloping, non-vertical sidewalls for the etched semiconductor. To reduce this detrimental contribution by the hard mask, we developed a plasma etch process to pattern the hard mask with trench patterns having vertical sidewalls, thereby eliminating the possibility of transferring sidewall slope from the hard mask to the semiconductor material to be etched. In one non-limiting embodiment, the hard mask is etched by using a halogen-based chemistry (e.g., employing a halogen gas, such as a gas including fluorine, chlorine, or bromine, such as $CX_4$, where each X is, independently, fluorine, chlorine, or bromine).

In another non-limiting embodiment, the hard mask is etched (e.g., to form a pattern) by using a fluorine-based chemistry. Fluorocarbon gas as the source of fluorine is one exemplary approach, but many sources of fluorine can be employed. Exemplary fluorocarbon gases include a perfluorocarbon gas (e.g., $C_xF_y$ gases, where x is an integer of 1 or more and y is an integer of 4 or more; such as $CF_4$, $C_2F_6$, $C_3F_6$, $C_4F_6$, $C_4F_8$, etc., including all isomers thereof); a fluorohydrocarbon gas (e.g., e.g., $C_xH_yF_z$ gases, where x is an integer of 1 or more, y is an integer of 1 or more, and z is an integer of 1 or more; such as $CHF_3$, $CH_2F_2$, etc., including all isomers thereof); a nitrogen fluoride gas (e.g., $NF_3$); a sulfur fluoride gas (e.g., $SF_6$); or any other mixtures including such gases (e.g., such as a mixture including Ar, $H_2$, $O_2$, $N_2$, etc., or mixtures of one or more fluorocarbon and/or fluorohydrocarbon gases). In particular embodiments, fluorine is present (e.g., to promote volatilization of the silicon in a $SiO_2$ hard mask). In other embodiments, carbon is present (e.g., to promote volatilization of the oxygen in a $SiO_2$ hard mask).

Etching (e.g., patterning) of the hard mask can be optimized in any useful manner. In one instance, the ratio of carbon to fluorine is minimized by selecting a gas having a greater proportion of fluorine, thereby limiting deposition of carbon on the sidewall of the hard mask during the etch process. In particular, carbon can deposit on the sidewall and reduce the sidewall slope. In another instance, the process pressure can be minimized to reduce ion-neutral collisions in the plasma sheath. The differential across the sheath tends to maintain incident ions normal to the planar surface, and higher pressure can increase gas density and increase the mean free path of an ion. Thus, higher pressure can lead to more ion-neutral collisions in the sheath, which can scatter the ions into off-normal trajectories, promote striking of the sidewall by the ions, and ultimately reduce sidewall slope. In yet another instance, a high radiofrequency power can be employed to provide a dense plasma, which shrinks the sheath and reduces ion-neutral collisions. Furthermore, a higher voltage differential can increase ion energy, thereby increasing momentum and decreasing the chance of ions being forced off of a normal trajectory.

If a photoresist is employed to pattern the hard mask, then the photoresist can be removed in any useful manner prior to the step of etching the semiconductor portion (e.g., a III-V portion). The photoresist can be removed, e.g., by an ash process (a dry process that uses heat and oxygen radicals to volatilize carbon in the photoresist) and/or by a solvent process (a wet process), in which the removal process can include both dry and wet processes.

The etching step 162 includes exposing the patterned semiconductor to plasma formed from a primary etchant gas. The exposed regions of the patterned semiconductor (e.g., the regions of the semiconductor material in underlying the trench pattern 135) are treated with plasma containing reactive ions of the etchant gas. In this way, exposed semiconductor material located in proximity to the trench pattern is etched primarily in an anisotropic manner (e.g., along the z-axis in FIG. 1) in order to provide a trench within the semiconductor material.

In particular, we have observed that vertical sidewalls are achieved when the primary etchant gas includes only $Cl_2$. Without wishing to be limited by mechanism, we believe that other non-$Cl_2$ agents, such as $BCl_3$, act as passivating agents when these agents are employed for the bulk of the etching process. For instance, industry standard plasma etches for films (e.g., aluminum films) typically use gas mixtures that include $Cl_2$, $BCl_3$, and $N_2$. However, we have observed that both $N_2$ and $BCl_3$ provide a passivating effect when used in the etch chemistry. When $BCl_3$ is employed during the bulk of the etching process, this molecule forms a passivating coating on the sidewalls, where this coating contributes to non-vertical sidewalls. Thus, for the AlN plasma etches described herein, we determined empirically that to achieve vertical sidewalls, it was necessary to remove $BCl_3$ and $N_2$ from the etch chemistry, leaving chlorine as the sole process gas. Accordingly, in some embodiments of the methods herein, the primary etchant gas contains primarily $Cl_2$. Particular favorable results were observed when this etch process was used with a patterned semiconductor having a hard mask.

Having determined the negative effects of $BCl_3$ during the primary or main etching step, we have also observed that controlled, supplemental exposure of $BCl_3$ (i.e., use of a supplementary gas including $BCl_3$) either before or after the primary etching step can be helpful. For instance, without wishing to be limited by mechanism, initial exposure of $BCl_3$ gas prior to the primary etching step can help initiate the etching process. In addition, subsequent exposure of $BCl_3$ gas after the primary etching step can help fully complete or land the etching process on the underlying insulator layer or substrate. As $BCl_3$ is a heavier molecule than $Cl_2$, it is generally understood that plasma containing $BCl_3$ provide more energetic ions and, thus, increase the etch rate, as compared to plasma containing solely $Cl_2$. However, to ensure that the primary etch is conducted by $Cl_2$ alone, the duration of the primary etch period should be greater than the duration of supplemental periods that employ $BCl_3$. In one instance, the duration of the primary etch period is, independently, 2, 3, 4, 5, 6, 7, 8, 9, 10, 15, 20, or more times greater than the duration of each supplemental period. In other embodiments, the duration of the primary etching period is of from about 100 seconds to about 400 seconds, and the duration of a supplemental period is of from about 5 second to about 50 seconds.

The removing step 163 includes removing the hard mask 130, thus providing an etched semiconductor having one or more trenches 141, 142. In particular embodiments, the removing step includes using an anisotropic plasma etch process that etches oxide but does not etch the underlying semiconductor material. This is an important distinction from an isotropic wet chemical etch because when an etchable insulator layer (e.g., an $SiO_2$ layer) underlies the semiconductor material, a wet chemical etch will remove the underlying insulator layer thus eliminating the benefits of that layer. Some benefits of the underlying insulator layer include providing a layer that isolates the resonator active layers from the substrate and compensates the resonator frequency for thermal effects.

The hard mask can be removed in any useful manner. In one instance, after etching the semiconductor portion, the hard mask is removed with an anisotropic plasma etch process that employs fluorine-based chemistry (e.g., one or more fluorocarbon gases). High etch rate selectivity is important, in which the hard mask is etched at a higher rate while minimizing the etch rate of the semiconductor material. Further, as the hard mask is etched, sputtering of the etched material (e.g., the etched $SiO_2$ material) should be minimized, as sputtered material can re-deposit on the sidewall of the semiconductor material.

High etch rate selectivity can be optimized in any useful manner. In one instance, the hard mask etching time can be optimized to stop as soon as all of the hard mask material has been etched. In another instance, a high carbon-content fluorocarbon gas mixture can be employed to preferentially deposit carbon on the semiconductor material. For example, when the semiconductor material includes AlN and the hard mask includes $SiO_2$, carbon deposits preferentially on AlN relative to $SiO_2$. Without wishing to be limited by mechanism, on a $SiO_2$ surface, carbon atoms react with surface oxygen atoms to form CO and $CO_2$, which are volatile molecules. In contrast, AlN is not reactive in such a similar manner, so carbon accumulates on the AlN surface and protects this AlN surface from sputtering by incident ions from the plasma. If this process is employed, then accumulated carbon can be removed from the semiconductor surface by any useful removal process (e.g., an ash process, which is a dry process that uses heat and oxygen radicals to volatilize carbon).

The releasing step 164 includes releasing a portion of the etched semiconductor, thereby providing a released resonator portion 150. In particular embodiments, releasing includes forming a trench 143 along an x- and/or y-axis, which defines a dimension of the resonator portion (e.g., a height dimension along the z-axis) and that allows the resonator portion to vibrate within a cavity surrounded by trenches that are etched into the semiconductor.

The methods herein can be modified to facilitate etching of any useful semiconductor material or to provide any useful semiconductor device. For instance, the semiconductor can include a release layer (e.g., an amorphous silicon release layer) that underlies the resonator portion. In this way, the release layer can be removed using CMOS compatible processes in order to release the resonator portion. In another instance, the release layer can be an ion-damaged region (e.g., in a single crystal semiconductor material) that can be removed by use of an etchant. Such ion-damaged regions can be helpful in predetermining the height (along the z-axis) of the resonator portion. Methods of forming ion-damaged region in semiconductor materials are described in Olsson R H et al., "A high electromechanical coupling coefficient SH0 Lamb wave lithium niobate micromechanical resonator and a method for fabrication," *Sens. Actuat. A* 2014; 209:183-90, which is incorporated herein by reference in its entirety.

Figure 2:
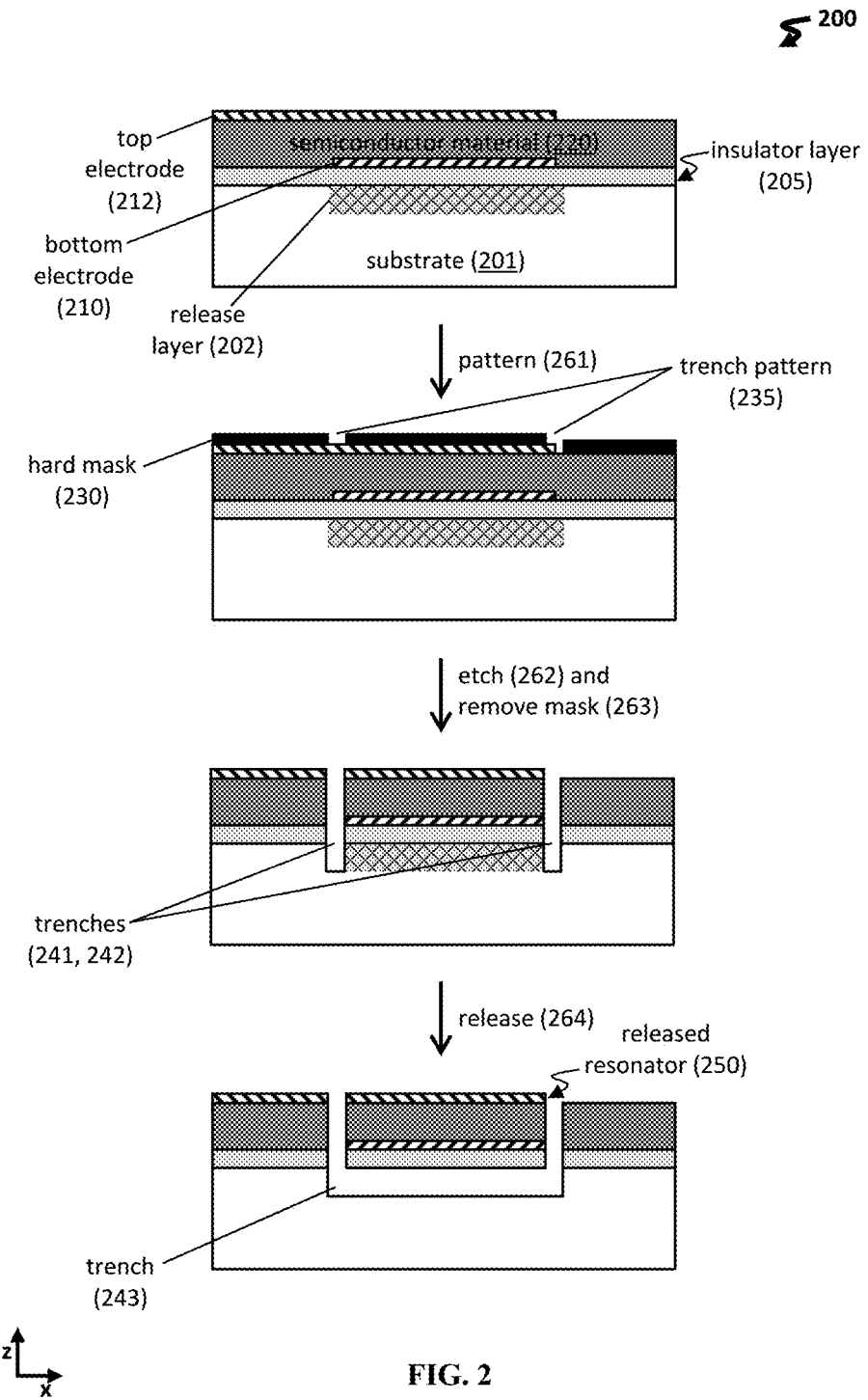
FIG. 2 is a schematic of another exemplary method 200 for etching a semiconductor.

FIG. 2 provides an exemplary method 200 for etching a semiconductor having a substrate 201, a release layer 202 located within the substrate and beneath the resonator portion, an insulator layer 205, and a semiconductor layer 220 disposed between two electrodes 210, 212. The method 200 includes patterning 261 a hard mask 230 on a planar surface of a semiconductor material, thereby providing a trench pattern 235 disposed within the hard mask 230; etching 262 the semiconductor material, as well as optionally etching the electrodes 210, 212, the insulator layer 205, and/or the substrate 201, or portions thereof; removing 263 the hard mask, thereby forming an etched semiconductor having one or more trenches 241, 242; and releasing 264 a portion of the semiconductor by removing the release layer 202, thereby forming a trench 243 and a released resonator 250.

Etching Parameters

The methods herein employ a dry etching process for etching the semiconductor material, as well as other materials or layers present in a stack (e.g., insulator layer(s), one or more electrode layers, release layer(s), diffusion barrier layer(s), substrate, etc.).

Figure 3A:
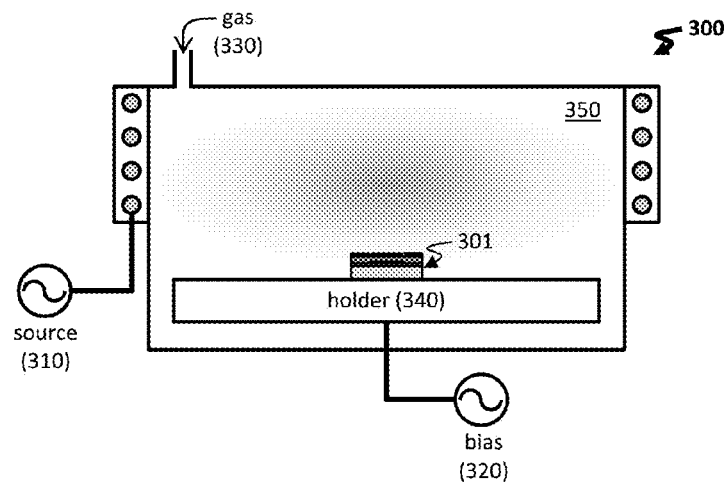
FIG. 3A-3B shows dry etching of a semiconductor using a plasma reactor 300 to provide reaction ions 355.

In one instance, the dry etching process employs plasma (e.g., include inductively coupled plasma (ICP), an electron-cyclotron-resonance (ECR) plasma, a helicon plasma, or a surface wave plasma) formed in a plasma reactor. FIG. 3A shows an exemplary plasma reactor 300 for performing the method of the invention. The reactor 300 includes a chamber 350 to contain the plasma, as well as a source generator 310 connected to an ICP coil surrounding the chamber 350. In addition, the reactor includes a holder 340 for supporting the semiconductor 301 within the chamber 350, a bias generator 320 connected to the holder 340, and an inlet 330 for introducing one or more etchant gases into the chamber 350, thereby controlling the composition of the etchant gas and the reactive species generated within the plasma.

Figure 3B:
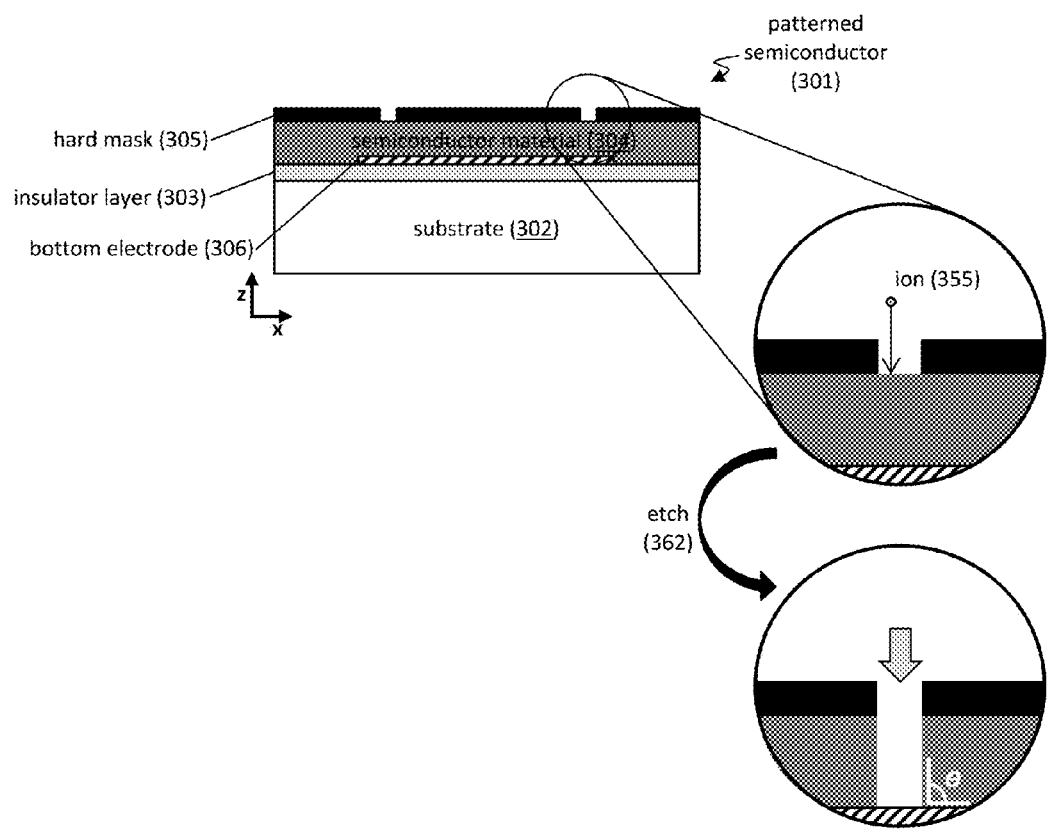

The etching parameters can be optimized for anisotropic etching in order to provide a vertical sidewall. For instance, as shown in FIG. 3B, the patterned semiconductor 301 can include a material to be etched (e.g., a semiconductor material 304), a hard mask 305, and any other optional layer(s) (e.g., a substrate 302, an insulator layer 303, and one or more electrodes 306). The patterned semiconductor includes both exposed surfaces and masked surfaces, as defined by the hard mask. When placed in a plasma reactor, the exposed surfaces are bombarded with reaction ions 355 during the etch step 362. When etching occurs preferentially in one direction (e.g., along the z-direction), then etching occurs anisotropically (along gray arrow in FIG. 3B). In particular, to obtain vertical sidewalls (along the z-direction), anisotropic etching is recommended.

The patterned semiconductor can have any useful mask, and the process can include one or more steps to remove the mask. In particular, we have observed that use of a hard mask results in more vertical sidewalls. Exemplary hard masks include those formed from silicon dioxide or silicon nitride, which can then be removed by any useful process (e.g., plasma dry etching with fluorine-containing plasma, such as $CF_4/O_2$ or $CHF_3/O_2$ plasma).

The extent of verticality of the sidewall can be determined in any useful manner. In one instance, the wall can be characterized by a sidewall angle θ, which is measured as shown in FIG. 3B (e.g., having a vertex at the intersection between a planar surface along the bottom of an etched trench, an edge of the etched semiconductor material, and an edge of the trench, as viewed from a cross-section of the semiconductor stack). As seen in FIG. 3B, sidewall angle θ is measured along the semiconductor material, and an angle measurement of 90° provides the ideal vertical sidewall.

Various parameters of the etching process can be optimized to provide a vertical sidewall, as well as any other useful structural feature (e.g., a smooth sidewall, a reduction in microtrenching, etc.). Exemplary parameters include source power (e.g., of from about 500 W to about 2000 W); bias (e.g., a high bias, such as of from about 40 W to about 200 W); pressure (e.g., a low pressure, such as less than about 25 mTorr, including of from about 5 mTorr to about 50 mTorr); and flow rate of the etchant gas (e.g., more than about 20 sccm (standard cubic centimeters per minute), such as of from about 40 sccm to 200 sccm).

In particular embodiments, the methods herein employ an etchant gas that is optimized for providing vertical sidewalls. For instance, we have determined that use of $Cl_2$ as an etchant gas promotes vertical sidewalls. In addition, $Cl_2$ need not be used for the entire etching process (though this is a viable option) because vertical sidewalls are obtained even when $Cl_2$ is employed during a majority (and not all) of the etching period. For instance, an exemplary etching protocol can include a first supplementary etch period include $BCl_3$ and $Cl_2$ (e.g., from about 5 to 50 seconds), a primary etch period including only $Cl_2$ (e.g., from about 100 to 400 seconds), and a second supplementary etch period include $BCl_3$ and $Cl_2$ (e.g., from about 5 to 50 seconds). In some instances, only one supplementary etch period is employed, e.g., either before or after the primary etch period.

Without wishing to be limited by mechanism, we believe that the $BCl_3$ provides two different effects. First, $BCl_3$ is a large molecule that can provide highly energetic, reactive ions for more effective etching. However, secondly, $BCl_3$ can also passivate the etched surface, thereby reducing uniform etching of the sidewall. We believe that these two effects can be controlled by controlling the amount of $BCl_3$ that is introduced with the primary etchant gas, as well as by controlling when $BCl_3$ is added during the etching process.

In other instance, the effects of etching can accommodated by proper design of the semiconductor stack. For example, at times, the semiconductor material overlies an insulator layer, such that portions of the insulator layer are exposed after etching the semiconductor material. Based on etching conditions, the insulator layer can become pitted or roughened during the etching process. In some instances, the semiconductor stack can be designed to include the insulator layer as a sacrificial layer that is later etched completely, such that surface roughening of the insulator layer does not affect the performance of the final device obtained from the etched semiconductor.

The methods herein can include any other useful modification or step, such as the use of a parallel plate reactor; implanting an ion-damaged region, such as that described in Olsson R H et al., *Sens. Actuat. A* 2014; 209:183-90, which is incorporated herein by reference in its entirety; as well as one or more post-etching steps, such as annealing, polishing, and/or ovenizing a resonator portion, such as any described in Kim B et al., "Ovenized and thermally tunable aluminum nitride microresonator," *Intl Ultrasonics Symp. Proc.*, held on 11-14 Oct. 2010, in San Diego, Calif., pp. 974-8; and U.S. Pat. No. 8,669,823, each of which is incorporated herein by reference in its entirety.

Additional modifications and steps are described in Danner D A et al., "Plasma etching of aluminum: a comparison of chlorinated etchants," *J. Electrochem. Soc.* 1987; 134(3): 669-73; Donnelly V M et al., "Plasma etching: yesterday, today, and tomorrow," *J. Vac. Sci. Technol. A* 2013; 31:050825 (48 pp.); Hahn Y B et al., "Effect of additive noble gases in chlorine-based inductively coupled plasma etching of GaN, InN, and AlN," *J. Vac. Sci. Technol. A* 1999; 17(3):768-73; Khan F A et al., "High rate etching of AlN using $BCl_3/Cl_2/Ar$ inductively coupled plasma," *Mater. Sci. Eng. B* 2002; 95:51-4; Shah A P et al., "ICP-RIE etching of polar, semi-polar and non-polar AlN: comparison of $Cl_2/Ar$ and $Cl_2/BCl_3/Ar$ plasma chemistry and surface pretreatment," *Semicond. Sci. Technol.* 2015; 30:015021 (6 pp.); Shah A P et al., "Inductively coupled plasma reactive ion etching of III-nitride semiconductors," *AIP Conf Proc.* 2013; 1512:494-5; Shul R J et al., "Selectively inductively coupled plasma etching of group-III nitrides in $Cl_2$- and $BCl_3$-based plasmas," *J. Vac. Sci. Technol. A* 1998; 16(3):1621-6; Yang J et al., "Researching the aluminum nitride etching process for application in MEMS resonators," *Micromachines* 2015; 6:281-90, as well as U.S. Pat. Nos. 4,256,534, 5,624,529, 7,081,415, and 7,196,017, each of which is incorporated herein by reference in its entirety.

Materials

The present invention relates to methods to etch any useful semiconductor material provided in any useful structure (e.g., a layer, a stack, etc.). In some instance, the material can be any that can be etched by chlorine. In some instances, the method is employed to etch a semiconductor including a semiconductor material. The semiconductor can include any other layers or materials, as described herein.

Exemplary semiconductor materials include a piezoelectric material (e.g., aluminum nitride (AlN), lithium niobate ($LiNbO_3$), or lithium tantalate ($LiTaO_3$), as well as single crystal forms of any useful piezoelectric material); a III-V material (e.g., AlN, AlGaN, AlInP, AlGaAs, GaAs, GaN, InP, InN, InAs, InSb, InAlN, InAlAs, InAlP, InGaN, InGaAs, AlGaInP, InGaAlAs, InGaAsP, etc., including III-nitride materials (e.g., including Al, In, Ga, As, and/or P), such as AlN, AlGaN, GaN, InN, InAlN, InGaN, etc.); a Si-containing material; an Al-containing material (e.g., Al, as well as alloys thereof, such as Al—Cu and Al—Si alloys); as well as doped forms and composite forms of any of these. The semiconductor material can be of any useful thickness (e.g., a thin film having a thickness of from about 100 nm to about 800 nm). These materials can be deposited in any useful manner, such as chemical vapor deposition (CVD), metal organic CVD (MOCVD), reactive sputtering, etc.

The hard mask can be formed from any useful material (e.g., $SiO_2$, silicon nitride (e.g., $Si_3N_4$), Mo, TiN, nickel (Ni), nickel-boron alloy, nickel-phosphorous alloy, chromium-gold alloy, titanium-gold alloy, etc.).

The semiconductor can include one or more insulator layers. Such insulators can be useful to electrically isolate an active layer from the underlying carrier substrate (e.g., a silicon substrate). Exemplary insulator materials include silicon dioxide, silicon nitride, etc.

The electrodes can be formed of any useful material, as well layers of a plurality of different materials, as described herein. In particular embodiments, the electrode has a stack structure that includes a conductive material and a diffusion barrier (e.g., a layer that limits diffusion of atoms between the conductive material and the substrate). In some particular embodiments, the conductive material of the electrode provides a dual function of conducting an electrical signal to the semiconductor material, as well as templating of the semiconductor material during deposition. The top electrode and the bottom electrode can be the same or different.

The semiconductor can include one or more electrodes having a conductive material (e.g., a conductive metal, such as aluminum (Al), titanium (Ti), gold (Au), copper (Cu), tungsten (W), molybdenum (Mo), platinum (Pt), ruthenium (Ru), tantalum (Ta), chromium (Cr), osmium (Os), rhenium (Re), iridium (Ir), germanium (Ge), as well as stacks, alloys, multilayers (e.g., TiW/AlCu or TiW/Cu layers), or doped forms of any of these). In some instances, the electrode can include a diffusion barrier that minimizes diffusion of atoms from the conductive material to other coextensive layers (e.g., a TiN diffusion barrier) and/or an adhesion layer (e.g., a Ti adhesion layer). The electrode can be electrically connected (e.g., by wiring) to one or more bond pads (e.g., contact pads and/or ground pads) to provide electrical input and output connections for the active region (e.g, the resonator portion).

Exemplary electrodes include an interdigitated transducer, a grating electrode, a thin film electrode, and/or a floating electrode having any useful thickness, period, material, or geometric arrangement and formed by any useful process, such as sputtering, vacuum deposition, or ion-plating. Exemplary electrodes are described in U.S. Pat. Nos. 8,497,747 and 8,522,411, each of which is incorporated herein by reference in its entirety. Arrays of n electrodes or n pairs of electrodes (e.g., n is 2, 4, 5, 10, 15, 20, 24, etc.) can also be incorporated with the microresonator of the invention. In particular embodiments, the electrode includes a lower resistive material to improve the quality factor and/or to operate at higher frequencies (e.g., any lower resistive material described herein, such as gold, silver, copper, aluminum, as well as doped forms thereof).

The semiconductor can have any other useful layers, such as a carrier substrate; a temperature compensation layer (e.g., formed of an insulator material, such as silicon dioxide); a tuning layer (e.g., formed from an annealable material, such as a Ti film, a TiN film, an Au—Cu film, as well as stacks thereof); and/or a release layer (e.g., amorphous silicon or damaged $LiNbO_3$). Additional materials and layers are described in Henry M D et al., "Frequency trimming of aluminum nitride microresonators using rapid thermal annealing," *J. Microelectromech. Sys.* 2014; 23(3):620-7; Henry M D et al., "Hermetic wafer-level packaging for RF MEMs: effects on resonator performance," *IEEE Electronic Components and Technology Conf*, held on 29 May-1 Jun. 2012, in San Diego, Calif., pp. 362-9; Kim B et al., "Capacitive frequency tuning of AlN micromechanical resonators," *Int'l Solid-State Sensors, Actuators and Microsystems Conf* ('*TRANSDUCERS*'), held on 5-9 Jun. 2011 in Beijing, China, pp. 502-5; Kim B et al., "Ovenized and thermally tunable aluminum nitride microresonator," *Int'l Ultrasonics Symp. Proc.*, held on 11-14 Oct. 2010, in San Diego, Calif., pp. 974-8; Marauska S et al., "Sputtered thin film piezoelectric aluminum nitride as a functional MEMS material," *Microsyst. Technol.* 2012; 18:787-95; Olsson R H et al., "A high electromechanical coupling coefficient SH0 Lamb wave lithium niobate micromechanical resonator and a method for fabrication," *Sens. Actuat. A* 2014; 209:183-90; Wojciechowski K E et al., "Single-chip precision oscillators based on multi-frequency, high-Q aluminum nitride MEMS resonators," *Int'l Solid-State Sensors, Actuators and Microsystems Conf* ('*TRANSDUCERS*'), held on 21-25 Jun. 2009 in Denver, Colo., pp. 2126-30; and Wojciechowski K E et al., "Super high frequency width extensional aluminum nitride (AlN) MEMS resonators," *IEEE Ultrasound Symp. Proc.*, held on 20-23 Sep. 2009, in Rome, Italy, pp. 1179-82, each of which is incorporated herein by reference in its entirety.

Uses

The methods herein can be employed to during any useful process and to fabricate any useful device. Exemplary uses include resonators, filters (e.g., band select filters), filter banks, oscillators, photonic devices, light-emitting diodes, photonic crystals, vertical cavity surface emitting lasers, reflectance modulators, photonic circuits, photonic waveguides, accelerometers, switches, sensors, ultrasonic transducers, microphones, field-effect transistors, heterojunction bipolar transistors, etc.

Additional uses are described herein, as well as in Aigner R, "MEMS in RF filter applications: thin-film bulk acoustic wave technology," *Sensors Update* 2003 February; 12(1): 175-210; Bliznetsov V et al., "Improving aluminum nitride plasma etch process for MEMS applications," *J. Micromech. Microeng.* 2013; 23:117001 (6 pp.); Chanchani R et al., "A new wafer-level packaging technology for MEMS with hermetic micro-environment," *IEEE Electronic Components and Technology Conf*, held on 31 May-3 Jun. 2011, in Lake Buena Vista, Fla., pp. 1604-9; Cleland A N et al., "Single-crystal aluminum nitride nanomechanical sensors," *Appl. Phys. Lett.* 2001; 79(13):2070-2; Fan L et al., "Aluminum nitride piezo-acoustic-photonic crystal nanocavity with high quality factors," *Appl. Phys. Lett.* 2013; 102:153507 (4 pp.); Kim B et al., "AlN microresonator-based filters with multiple bandwidths at low intermediate frequencies," *J. Microelectromech. Sys.* 2013; 22(4):949-61; Liang J et al., "Design and fabrication of aluminum nitride Lamb wave resonators toward high figure of merit for intermediate frequency filter applications," *J. Micromech. Microeng.* 2015; 25:035016 (10 pp.); Malocha D C, "SAW/BAW acoustoelectronic technology for filters and communication systems," *Proc. 2010IEEE 11th Annu. Wireless & Microwave Technol. Conf (WAMICON)*, held on 12-13 Apr. 2010 in Melbourne, Fla., pp. 1-7; Néel D et al., "Aluminum nitride photonic crystals and microdiscs for ultra-violet nanophotonics," *Adv. Nat. Sci.* 2014; 5:023001 (7 pp.); Nordquist C D et al., "On/off micro-electromechanical switching of AlN piezoelectric resonators," *IEEE MTT-S Int? Microwave Symp. Digest*, held on 2-7 Jun. 2013 in Seattle, Wash., pp. 1-4; Olsson R H et al., "Post-CMOS-compatible aluminum nitride resonant MEMS accelerometers," *J. Microelectromech. Sys.* 2009; 18(3):671-8; Olsson R H et al., "Post-CMOS compatible aluminum nitride MEMS filters and resonant sensors," *IEEE Int'l Frequency Control Symp. joint with the European Frequency and Time Forum*, held on 29 May-1 Jun. 2007, in Geneva, Switzerland, pp. 412-9; Pernice W H P et al., "High-Q aluminum nitride photonic crystal nanobeam cavities," *Appl. Phys. Lett.* 2012; 100: 091105 (4 pp.); Piazza G et al., "Piezoelectric aluminum nitride thin films for microelectromechanical systems," *MRS Bull.* 2012; 37:1051-61; Xiong C et al., "Aluminum nitride as a new material for chip-scale optomechanics and nonlinear optics," *New J. Phys.* 2012; 14:095014 (21 pp.); Xiong C et al., "Low-loss, silicon integrated aluminum nitride photonic circuits and their use for electro-optic signal processing," *Nano Lett.* 2012; 12:3562-8; and Yantchev V et al., "Thin film Lamb wave resonators in frequency control and sensing applications: a review," *J. Micromech. Microeng.* 2013; 23:043001 (14 pp.), as well as U.S. Pat. Nos. 7,385, 334 and 8,497,747, each of which is incorporated herein by reference in its entirety.

In particular embodiments, the methods herein are employed to form a resonator. Exemplary resonators includes a Lamb wave resonator having a plate resonating portion; a thickness mode acoustic wave resonator having longitudinal elastic waves traveling though the solid material; a contour mode resonator having a suspended resonating portion; as well as thickness-field excitation and lateral field excitation resonators thereof. In addition, the resonator can be optimized to promote symmetric modes, asymmetric modes, and/or shear modes of the acoustic wave propagating in the piezoelectric crystal. Spurious modes can be reduced by any useful method, such as by rotating bond/contact pads.

Additional microresonators (e.g., length-extensional resonators, contour mode resonators, thickness mode resonators, ring resonators, and bar resonators) and anchoring region designs are described in U.S. Pat. Nos. 7,652,547, 8,367,305, and 8,669,823; Wang R et al., "Thin-film lithium niobate contour-mode resonators," *Proc. 2012 IEEE Int'l Ultrason. Symp.* (*IUS*), held on 7-10 Oct. 2012, in Dresden, Germany, pp. 303-6; and Kadota M et al., "High-frequency Lamb wave device composed of MEMS structure using $LiNbO_3$ thin film and air gap," *IEEE Trans. Ultrason. Ferroelectr. Freq. Control* 2010 November; 57(11):2564-71, each of which is incorporated herein by reference in its entirety.

EXAMPLES

Example 1

Experimental Setup for Etching Studies

Etching studies were conducted employing aluminum nitride (AlN) as the semiconductor material, although other materials etchable can be employed (e.g., as described herein). Semiconductor stacks were fabricated as follows.

First, we deposited an insulator layer ($SiO_2$) on bare silicon (Si) wafers. Then, we deposited a bottom electrode film on the $SiO_2$ layer. In our instantiation, we employed Al (a conductor, which also served as a grain-orienting template for AlN deposition) on TiN (a diffusion barrier between Al and the Si substrate), though other conductive film stacks can be employed. Optical lithography and plasma etch processes were used to define the electrode.

Then, we deposited AlN over the bottom electrode and the $SiO_2$ layer. Optical lithography and subtractive etch processes were used to define tapered vias through the AlN layer and to expose the bottom electrode.

Next, we deposited a top electrode layer, which included aluminum, on a top surface of the AlN layer. Lithographically patterning and subtractively etching were used to define the top electrode with a pattern that enables independent control of the top and bottom electrodes.

Finally, we deposited a $SiO_2$ layer on the top surface of the stack. This $SiO_2$ layer served as a hard mask that defines the dimensions of the AlN resonating structure. To define the resonator, we lithographically patterned and subtractively etched the oxide hard mask, with the etch stopping on AlN. For this subtractive etch, we used a plasma etch process that resulted in perfectly vertical sidewalls. Any slope in the sidewalls of the hard mask can transfer into the AlN layer, thereby degrading subsequent resonator performance. After etching the $SiO_2$ layer to define trench patterns within the hard mask, we removed the photoresist that was applied and patterned during the previous lithography step. The photoresist contained carbon, which could contribute to non-vertical sidewalls during the AlN etch process. After the photoresist was removed, we subtractively etched the AlN, thereby providing a patterned semiconductor to be processed by any of the AlN etching conditions described herein.

After the AlN etch, the hard mask was removed, and the resonator was released. In particular, the oxide hard mask was removed by using a highly selective, anisotropic oxide etch, which etched the oxide mask but not AlN nor the electrodes. This is an important distinction from an isotropic wet chemical etch because the semiconductor stacks herein uses a silicon dioxide film under the AlN film in order to isolate the resonator from the substrate and to compensate the resonator frequency for thermal effects. A wet chemical etch will remove the underlying oxide film, thus eliminating the benefits of that film. The resonator was released from the underlying silicon substrate by an isotropic dry etch including fluorine.

Example 2

Overview of Etching Parameters

Etching studies were conducted employing AlN, which is a material beneficial for fabricating Radio Frequency (RF) MEMS micro resonators. The piezoelectric transduction mechanism of these resonators allows the realization of low insertion loss filters. In addition, the resonant frequency of these resonators is determined lithographically, such that resonators having different resonant frequencies can be fabricated on the same wafer. Of course, to fully realize the benefits that could be provided by AlN-based resonators, fabrication processes should be optimized. In particular, with respect to lithographic processes, any such processes should provide vertical sidewalls in order to provide useful quality factors. Thus, one of the goals is to provide post-etch profile of the AlN material that is vertical.

The etching processes were optimized by employing the same equipment and materials that are used in the manufacture of integrated circuits, thereby ensuring that any developed methods can be incorporated with existing MEMS processes. Experiments were conducted using the semiconductor stack as described in Example 1. Several parameters were tested employing low pressure etching conditions. The effects of a few of these parameters are described as follows.

We evaluated two different mask materials (photoresist or hard mask with $SiO_2$) at different thicknesses. The mask material had a significant effect on sidewall verticality, whereas mask thickness did not have a significant effect. The use of oxide hard marks provided a more vertical sidewall. Generally, photoresist masks are employed in etching processes. We have decided to omit use of such photoresist masks that can re-deposit on the sidewall as a passivating polymer.

Figure 4:
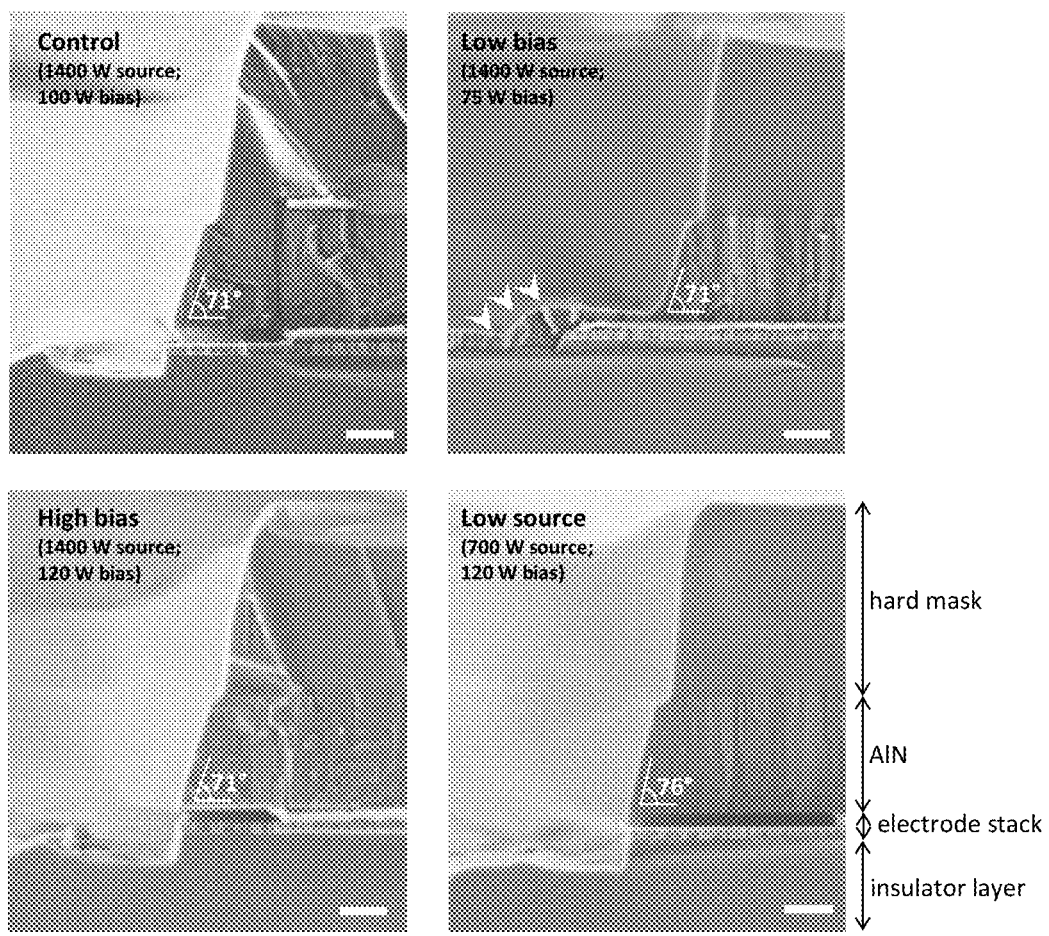
FIG. 4 shows the effect of varying source and bias parameters for the etching process. Provided are cross-sectional scanning electron microscopy (SEM) images of a sidewall for a semiconductor stack processed using different conditions, as described herein. Images are provided from the center of the stack and have been reversed, as needed, to provide the sidewall on the right side of the image. Scale bars are 300 μm.

Other etching parameters were varied. First, we altered source power and bias power, as shown in Table 1 below, and exemplary SEM images are provided in FIG. 4. Under our tested conditions, altering source power and bias power impacted etching rate but did not affect the sidewall angle. In fact, a range of source and bias powers provided good results. This observation provides a useful method in which source power and/or bias power can be altered by the user to obtain the desired etching rate without negatively impacting the sidewall angle.

TABLE 1

Effect of bias and source power

| Parameters | Test Conditions | | | |
|---|---|---|---|---|
| | Control [A] | Low bias [B] | High bias [C] | Low source [D] |
| Source [W] | 1400 | 1400 | 1400 | 700 |
| Bias [W] | 100 | 75 | 120 | 120 |
| $Cl_2$ [sccm] | 90 | 90 | 90 | 90 |
| $BCl_3$ [sccm] | 40 | 40 | 40 | 40 |
| Ar [sccm] | 0 | 0 | 0 | 0 |
| $O_2$ [sccm] | 0 | 0 | 0 | 0 |
| Pressure [mTorr] | 10 | 10 | 10 | 10 |
| Etch time [sec] | 210 | 210 | 210 | 210 |

Second, we altered the composition of the etchant gas. Varied parameters are provided in Table 2 below, and exemplary SEM images are provided in FIG. 5.

TABLE 2

Effect of etchant gas composition

| Parameters | Test Conditions | | | | | |
|---|---|---|---|---|---|---|
| | Control ($Cl_2/BCl_3$) [A] | $Cl_2$ [E] | $Cl_2/BCl_3/O_2$ [F] | $BCl_3/Ar$ [G] | $Cl_2$ (first etch); $Cl_2/BCl_3$ (second etch) [H] | |
| Source [W] | 1400 | 1400 | 1400 | 1400 | 1400 | 700 |
| Bias [W] | 100 | 100 | 100 | 100 | 150 | 120 |
| $Cl_2$ [sccm] | 90 | 130 | 80 | 0 | 130 | 90 |
| $BCl_3$ [sccm] | 40 | 0 | 30 | 90 | 0 | 40 |
| Ar [sccm] | 0 | 0 | 0 | 40 | 0 | 0 |
| $O_2$ [sccm] | 0 | 0 | 20 | 0 | 0 | 0 |
| Pressure [mTorr] | 10 | 10 | 10 | 10 | 10 | 10 |
| Etch time [sec] | 210 | 210 | 210 | 210 | 210 | 90 |

The etchant gas was altered in various ways. For instance, we removed $BCl_3$ as component of the primary etchant gas (Condition [E] in Table 2, upper right image in FIG. 5). The sidewall angle was improved, though the field was rough. In our design, the field is a sacrificial layer that will be later removed in order to release the resonator. In addition, other parameters (e.g., etching period) can be optimized to minimize surface roughness.

Figure 5:
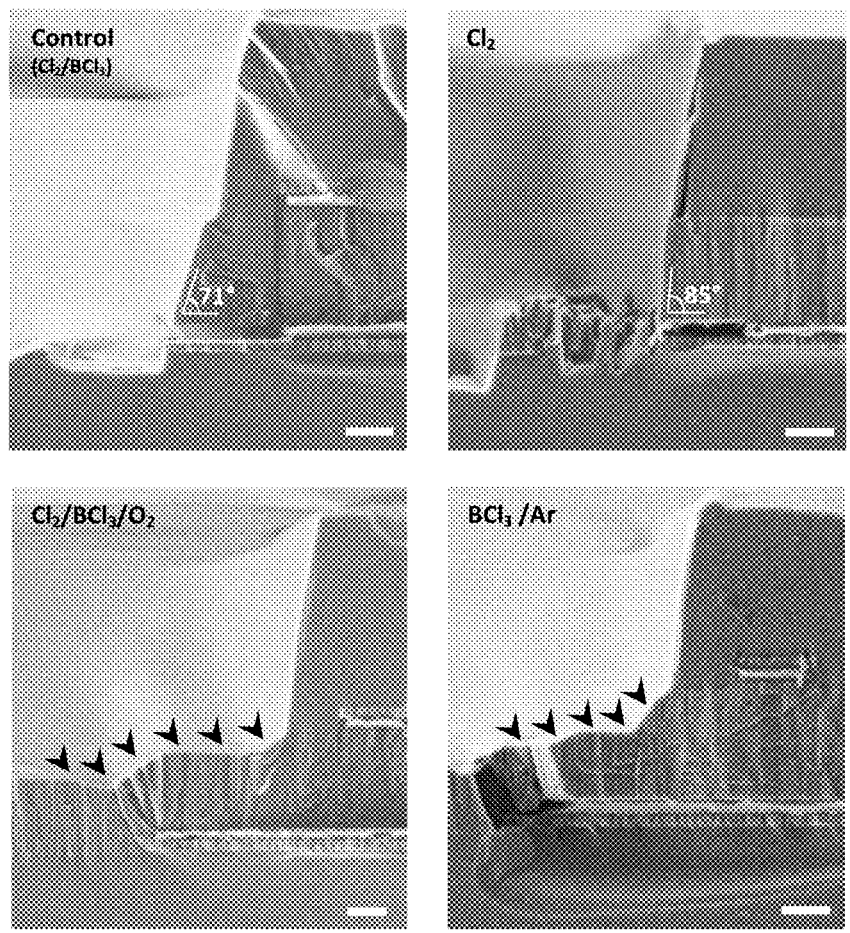
FIG. 5 shows the effect of varying the composition of the etchant gas for the etching process. Provided are cross-sectional SEM images of a sidewall for a semiconductor stack processed using different conditions, as described herein. Images are provided from the center of the stack and have been reversed, as needed, to provide the sidewall on the right side of the image. Scale bars are 300 μm.

Also, we eliminated $O_2$ as a component of the primary etchant gas (Condition [G] in Table 2, lower right image in FIG. 5). $O_2$ is frequently added to the etchant gas to remove etch polymer from sidewalls, thereby improving sidewall verticality. Under our tested conditions, we observed that $O_2$ addition had a detriment effect of sidewall verticality. Without wishing to be limited by mechanism, the addition of $O_2$ inhibited etching overall, possibly by forming an alumina film.

Figure 6:
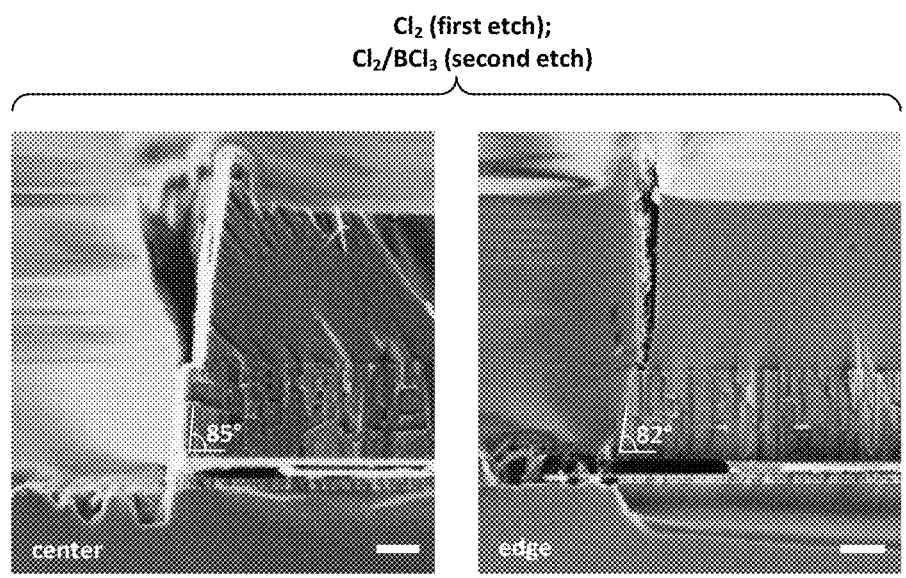
FIG. 6 shows a semiconductor stack processed with two subsequent etches, in which the first etch includes a $Cl_2$ etchant gas and the second etch includes $Cl_2$ combined with $BCl_3$ as the etchant gas. Provided are cross-sectional SEM images of a sidewall from either the center or the edge of the stack, as indicated. In addition, SEM image have been reversed, as needed, to provide the sidewall on the right side of the image. Scale bars are 300 μm.
Figure 7A:
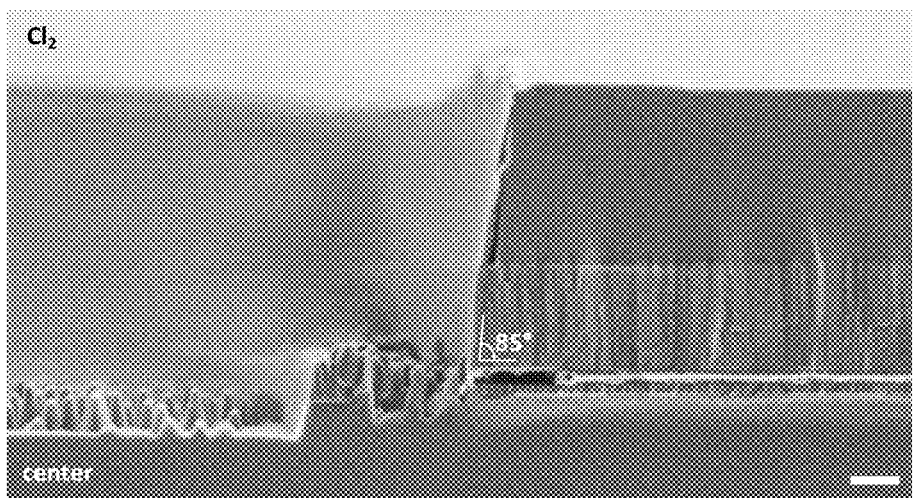
FIG. 7A-7D shows a semiconductor stack processed with a single etch including only $Cl_2$ as the primary etchant gas. Provided are SEM images of (A) a cross-sectional view of a sidewall from the center of the stack; (B) a cross-sectional view of a sidewall from the edge of the stack; (C) views from the center of the stack, including (left) a perspective view of the sidewall and the field and (right) a front view of the sidewall; and (D) views from the edge of the stack, including (left) a perspective view of the sidewall and the field and (right) a front view of the sidewall
Figure 7B:
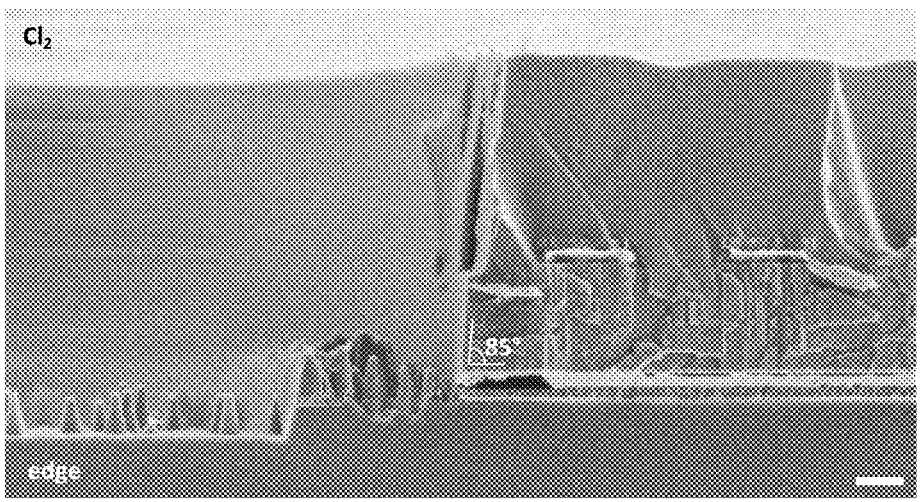
Figure 7C:
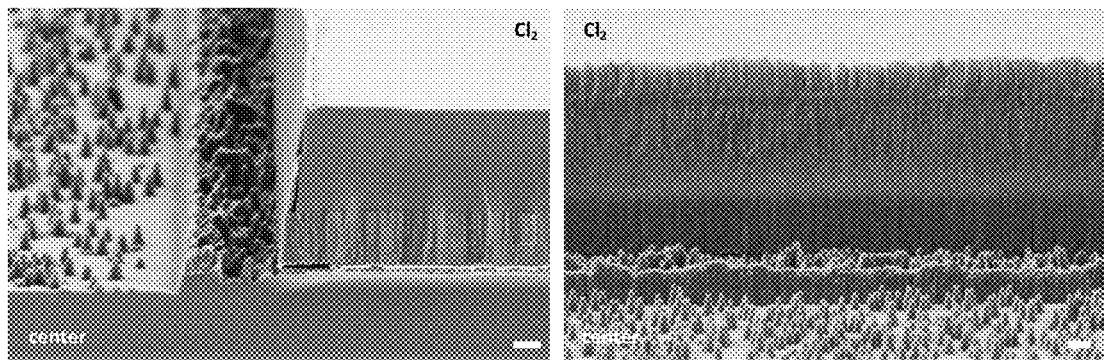
Figure 7D:
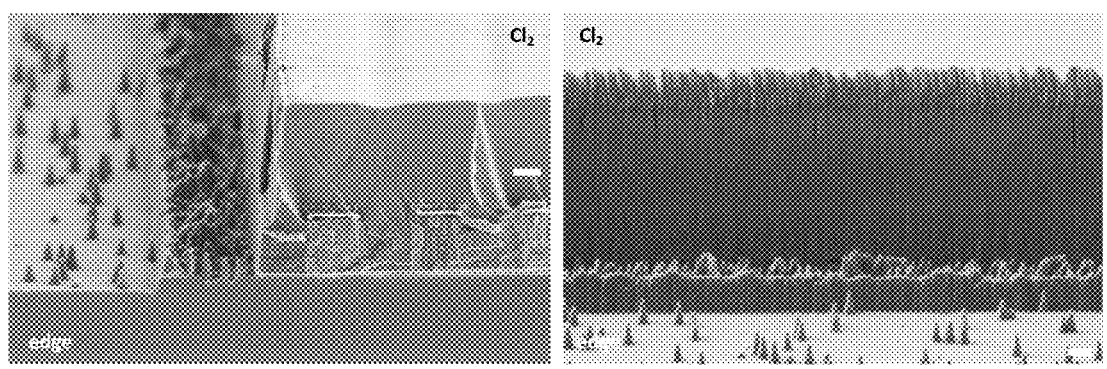
Figure 8:
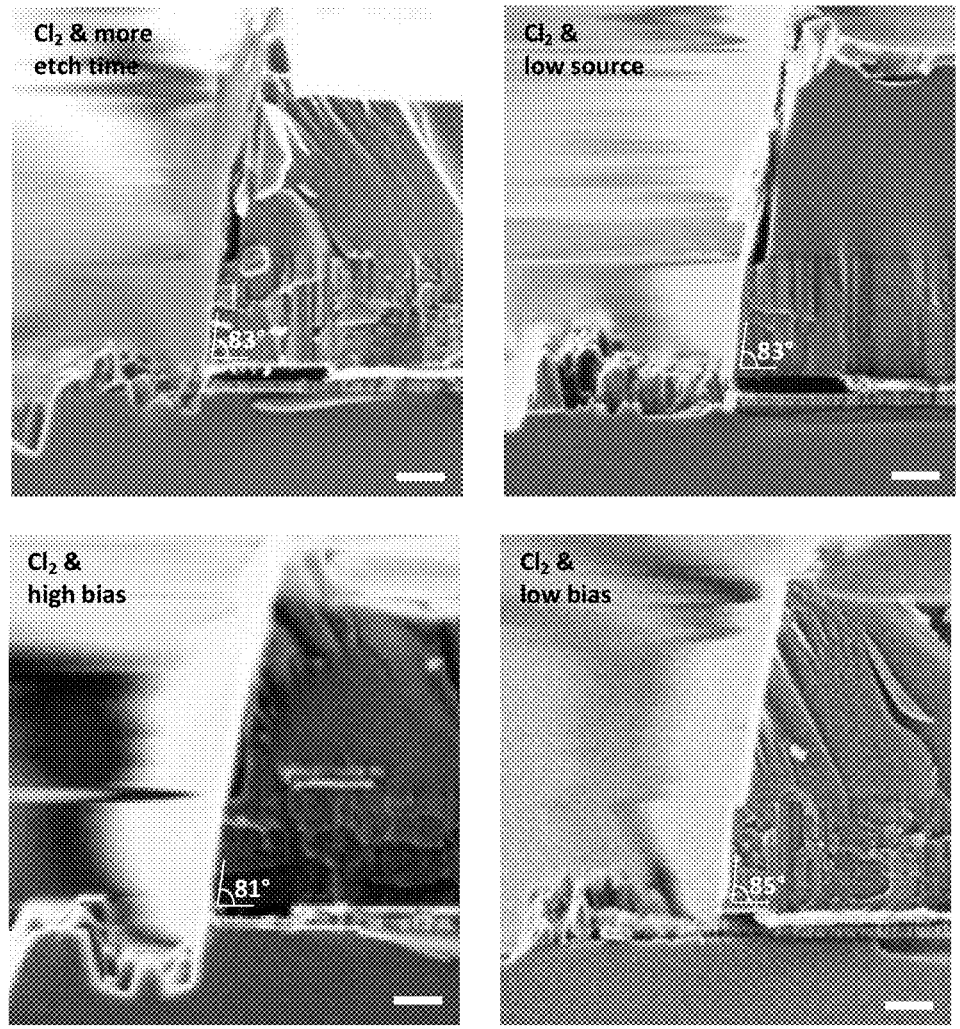
FIG. 8 shows the effect of maintaining $Cl_2$ as the primary etchant gas while varying the source, bias, and etching period parameters for the etching process. Provided are cross-sectional SEM images of a sidewall from the center of the stack using different conditions, as described herein. In addition, SEM image have been reversed, as needed, to provide the sidewall on the right side of the image. Scale bars are 300 μm.
Figure 9:
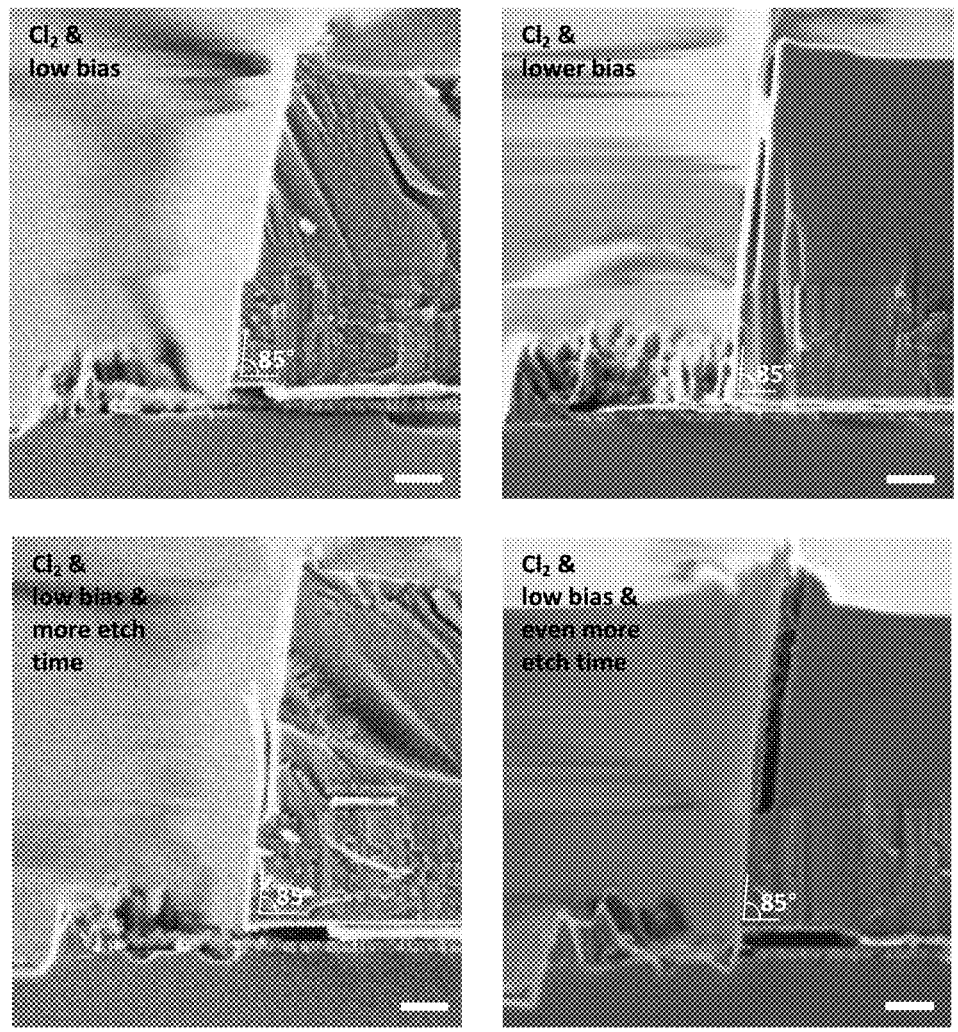
FIG. 9 shows the effect of maintaining $Cl_2$ as the primary etchant gas while varying the bias and etching period parameters for the etching process. Provided are cross-sectional SEM images of a sidewall from either the center or the edge of the stack using different conditions, as described herein. In addition, SEM image have been reversed, as needed, to provide the sidewall on the right side of the image. Scale bars are 300 μm.

Additional steps were included during etching. We included overetches or supplemental etches, in which a primary etch was combined with a supplemental etch step conducted either before and/or after the primary etch. In one example, we conducted a two-step etch, in which the first step only included $Cl_2$ and the second step included $Cl_2$ and $BCl_3$ (Condition [H] in Table 2, images in FIG. 6). Without wishing to be limited by mechanism, such supplemental steps can be employed to add a heavy molecule (e.g., $BCl_3$) that may mitigate micromasking. Overetches provided some improvement of the vertical sidewall angle.

Plasma etches for aluminum-containing films typically use gas mixtures that include $Cl_2$, $BCl_3$, and $N_2$. However, in the conditions tested herein, both $BCl_3$ and $N_2$ provided a passivating effect, which resulted in a non-vertical AlN sidewall. For this reason, we removed or minimized $BCl_3$ and $N_2$ from the primary etch chemistry, leaving chlorine as the sole process gas. However, $BCl_3$ can be introduced at discrete moments, e.g., at the start of the primary etch step to encourage initiation of etching and/or at the end of the primary etch step (e.g., after most of the film is etched) to help fully land the etch on the underlying insulator layer. An exemplary process includes use of $BCl_3$ for the first 10 seconds and last 20 seconds of an etch that has a duration of about 180 seconds.

Example 3

Further Studies with $Cl_2$ as the Primary Etchant Gas

Based on the favorable results with $Cl_2$ as primary etchant gas, further studies were conducted employing a low pressure, high bias power plasma process with $Cl_2$ as the primary reactive gas. Test parameters are provided in Table 3 below, and SEM images are provided in FIGS. 7A-7D, 8, and 9.

FIG. 7A-7D provides SEM images of sidewalls obtained using $Cl_2$ as the sole process gas (Condition [E] in Table 3 below). In particular, images show that the improved sidewall angle (about 85°) is observed at both the center and edge of the patterned semiconductor (compare FIGS. 7A and 7B). Extended views show that the field has various micromasking structures (see FIGS. 7C and 7D), which are deposited on a release layer that will be removed when isolating the resonator portion. Thus, these micromasking structures should not detrimentally affect performance of the resonator.

TABLE 3

Further modifications employing $Cl_2$ as the primary etchant gas

| Parameters | Test Conditions | | | | | | | |
|---|---|---|---|---|---|---|---|---|
| | $Cl_2$ [E] | $Cl_2$ & more etch time [E-1] | $Cl_2$ & low source [E-2] | $Cl_2$ & high bias [E-3] | $Cl_2$ & low bias [E-4] | $Cl_2$ & lower bias [E-5] | $Cl_2$, low bias, & more etch time [E-6] | $Cl_2$, low bias, & even more etch time [E-7] |
| Source [W] | 1400 | 1400 | 700 | 1400 | 1400 | 1400 | 1400 | 1400 |
| Bias [W] | 100 | 100 | 100 | 150 | 75 | 50 | 75 | 75 |
| $Cl_2$ [sccm] | 130 | 130 | 130 | 130 | 130 | 130 | 130 | 130 |
| $BCl_3$ [sccm] | 0 | 0 | 0 | 0 | 0 | 0 | 0 | 0 |
| Ar [sccm] | 0 | 0 | 0 | 0 | 0 | 0 | 0 | 0 |
| $O_2$ [sccm] | 0 | 0 | 0 | 0 | 0 | 0 | 0 | 0 |
| Pressure [mTorr] | 10 | 10 | 10 | 10 | 10 | 10 | 10 | 10 |
| Etch time [sec] | 210 | 300 | 210 | 210 | 210 | 210 | 270 | 360 |

Further parameters were varied, while maintaining $Cl_2$ as the main process gas. These parameters included source power, bias power, and etch time. Under the tested conditions (e.g., low pressure, high bias conditions), all of these variations provided vertical sidewalls (e.g., a vertical sidewall angle θ greater than about 80°).

Other Embodiments

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A method for etching a semiconductor, the method comprising:
placing a patterned semiconductor into a plasma reactor, wherein the patterned semiconductor comprises a semiconductor material and a hard mask disposed directly or indirectly on a planar surface of the semiconductor material, and wherein the hard mask defines at least one trench pattern;
introducing a first supplementary gas into the plasma reactor for a first supplemental period, wherein the first supplementary gas comprises $BCl_3$ and wherein a duration of the first supplemental period is less than a duration of a primary etching period;
etching an exposed semiconductor material located in proximity to the trench pattern by introducing a primary etchant gas into the plasma reactor for the primary etching period, wherein the primary etchant gas comprises $Cl_2$ and does not include $BCl_3$, thereby providing an etched semiconductor; and
introducing a second supplementary gas into the plasma reactor for a second supplemental period, wherein the second supplementary gas comprises $BCl_3$ and wherein a duration of the second supplemental period is less than a duration of the primary etching period.

2. The method of claim 1, wherein the at least one trench pattern of the hard mask was etched by employing a plasma etch process.

3. The method of claim 1, wherein the plasma reactor is an inductively coupled plasma reactor.

4. The method of claim 3, wherein the inductively coupled plasma reactor is operated at a source power of from about 500 W to about 2000 W and at a bias of from about 40 W to about 200 W.

5. The method of claim 1, wherein the plasma reactor is maintained at a low operating pressure less than about 25 mTorr.

6. The method of claim 1, wherein the primary etchant gas consists essentially of $Cl_2$.

7. The method of claim 1, wherein the duration of the primary etching period is of from about 100 seconds to about 400 seconds.

8. The method of claim 1, wherein the semiconductor material comprises a piezoelectric material selected from the group consisting of an aluminum nitride, a III-V material, lithium niobate, lithium tantalate, and doped forms thereof.

9. The method of claim 1, wherein the patterned semiconductor comprises a semiconductor stack.

10. The method of claim 9, wherein the semiconductor stack comprises a piezoelectric layer, a bottom electrode layer disposed beneath the piezoelectric layer, and an insulator layer disposed between the bottom electrode layer and a substrate.

11. The method of claim 10, wherein the substrate further comprises a release layer.

12. The method of claim 1, wherein a vertical sidewall of the etched semiconductor has a sidewall angle greater than about 80°.

13. The method of claim 1, wherein the duration of the first supplemental period is from about 5 seconds to about 50 seconds, and wherein the duration of the primary etching period is from about 100 seconds to about 400 seconds.

14. The method of claim 1, wherein the duration of the second supplemental period is from about 5 seconds to about 50 seconds, and wherein the duration of the primary etching period is from about 100 seconds to about 400 seconds.

15. The method of claim 1, further comprising, after the etching step:
removing the hard mask by employing a selective anisotropic oxide etch.

16. The method of claim 15, further comprising, after the removing step:
releasing a portion of the etched semiconductor, thereby providing a released resonator portion.

17. The method of claim 16, wherein the patterned semiconductor comprises a semiconductor stack comprising a release layer, and wherein the releasing step comprises etching the release layer.

18. A method for etching a semiconductor, the method comprising:
placing a patterned semiconductor into a plasma reactor, wherein the patterned semiconductor comprises a semiconductor material and a hard mask disposed directly or indirectly on a planar surface of the semiconductor material, and wherein the hard mask defines at least one trench pattern;
introducing a first supplementary gas into the plasma reactor for a first supplemental period, wherein the first supplementary gas comprises $BCl_3$;
etching an exposed semiconductor material located in proximity to the trench pattern by introducing a primary etchant gas into the plasma reactor for a primary etching period, wherein the primary etchant gas comprises $Cl_2$ and does not include $BCl_3$;
introducing a second supplementary gas into the plasma reactor for a second supplemental period, wherein the second supplementary gas comprises $BCl_3$; and
removing the hard mask by employing a selective anisotropic oxide etch, thereby providing an etched semiconductor,
wherein a duration of each of the first and the second supplemental periods is, independently, less than a duration of the primary etching period.

19. The method of claim 18, wherein the duration of each of the first and second supplemental period is from about 5 second to about 50 seconds; and wherein the duration of the primary etching period is from about 100 seconds to about 400 seconds.

20. A method for fabricating a semiconductor resonator, the method comprising:
placing a patterned semiconductor into a plasma reactor, wherein the patterned semiconductor comprises a piezoelectric material and a hard mask disposed directly or indirectly on a planar surface of the piezoelectric material, and wherein the hard mask defines at least one trench pattern that provides a first dimension of a resonator portion;
introducing a first supplementary gas into the plasma reactor for a first supplemental period, wherein the first supplementary gas comprises $BCl_3$;
etching an exposed semiconductor material located in proximity to the trench pattern by introducing a primary etchant gas into the plasma reactor for a primary etching period, wherein the primary etchant gas comprises $Cl_2$ and does not include $BCl_3$, thereby defining at least one dimension of the resonator portion;
introducing a second supplementary gas into the plasma reactor for a second supplemental period, wherein the second supplementary gas comprises $BCl_3$;
removing the hard mask by employing a selective anisotropic oxide etch; and
releasing a portion of the etched semiconductor, thereby defining a second dimension of the resonator portion and providing the semiconductor resonator,
wherein a duration of each of the first and the second supplemental periods is, independently, less than a duration of the primary etching period.

21. The method of claim 20, wherein the piezoelectric material comprises an aluminum nitride, a III-V material, lithium niobate, lithium tantalate, and doped forms thereof; and wherein a vertical sidewall of the semiconductor resonator has a sidewall angle greater than about 80°.

22. The method of claim 20, wherein the duration of each of the first and second supplemental period is from about 5 second to about 50 seconds; and wherein the duration of the primary etching period is from about 100 seconds to about 400 seconds.

* * * * *